United States Patent [19]

Davis et al.

[11] Patent Number: 4,876,519
[45] Date of Patent: Oct. 24, 1989

[54] HIGH FREQUENCY ECL VOLTAGE CONTROLLED RING OSCILLATOR

[75] Inventors: Craig M. Davis, Santa Clara; Richard R. Rasmussen, Fremont, both of Calif.

[73] Assignee: National Semiconductor Corporation, Santa Clara, Calif.

[21] Appl. No.: 299,768

[22] Filed: Jan. 23, 1989

[51] Int. Cl.$^4$ .................................. H03B 1/00
[52] U.S. Cl. .............................. 331/57; 331/108 B
[58] Field of Search ............ 331/25, 34, 57, 108 B, 331/177 R; 307/455

[56] References Cited

U.S. PATENT DOCUMENTS 4,565,976  1/1986  Campbell ............................ 331/57

Primary Examiner—Eugene R. LaRoche
Assistant Examiner—Robert J. Pascal
Attorney, Agent, or Firm—Limbach, Limbach & Sutton

[57] ABSTRACT

An emitter-coupled logic (ECL) gate configuration is provided that allows variations in the bias current for controlling propagation delay. The emitter coupled logic circuitry includes a plurality of input transistors having commonly-coupled emitters. The collector of each input transistor is connected to receive a control voltage. A current source is connected between the commonly-coupled emitters and ground. Circuitry, preferably a variable resistance, is connected between the collectors of the input transistors and a supply voltage. A bias voltage controls the charging current provided to the collectors of the ECL input transistors.

11 Claims, 3 Drawing Sheets

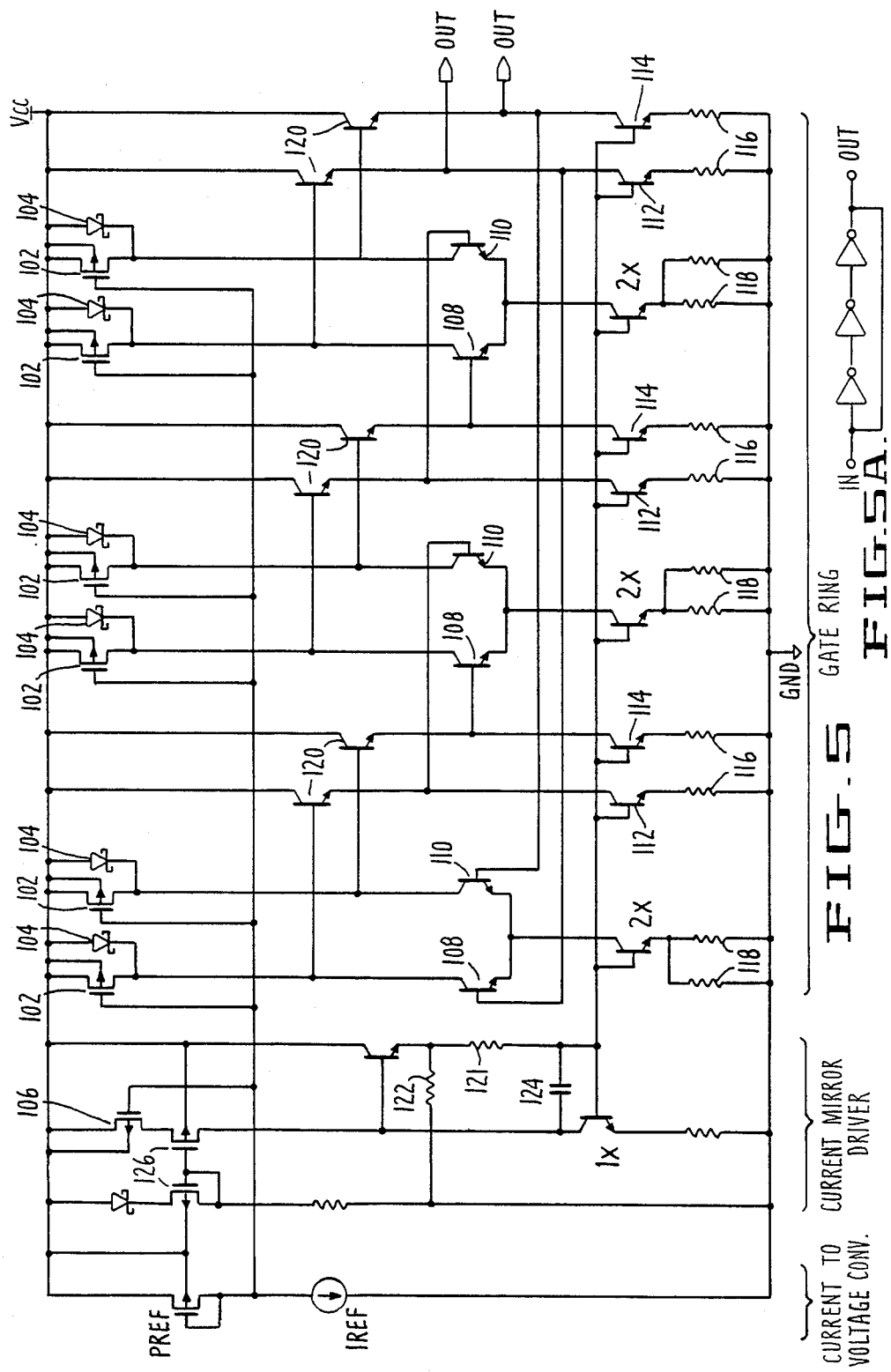

HIGH FREQUENCY ECL VOLTAGE CONTROLLED RING OSCILLATOR

BACKGROUND OF THE INVENTION

1. Field of the Invention

The present invention relates to clock generators and, in particular, to an emitter-coupled logic (ECL) gate configuration that allows variations in the bias current for controlling propagation delay. The disclosed ECL gate configuration has particular application in a voltage controlled ring oscillator.

2. Discussion of the Prior Art

A voltage controlled oscillator (VCO) generates periodic signals which are converted into a square wave output which can be used to provide timing pulses in various logic circuits. The output frequency of a VCO is a function of its input control voltage.

VCOs are commonly used in phase-locked loop (PLL) circuits. As shown in the FIG. 1 block diagram, a general purpose PLL 10 typically includes a phase comparator 12, a low-pass filter 14 with some gain, and a VCO 16. The phase comparator 12 compares the frequency and the phase of the input signal and of the VCO 16 and generates either a positive or a negative error voltage $V_e$ which is filtered and applied, as $V_d$, to the VCO 16. If the input signal is within the capture range of the PLL 10, then the VCO 16 will lock onto the input frequency $f_s$ and generate an output signal of the same frequency as $f_s$ with a small fixed phase difference. Once the VCO 16 is locked onto the input signal, its output frequency $f_o$ will vary over the locking range as the input frequency $f_s$ varies.

VCOs have been implemented in the past using transistor-transistor logic (TTL) technology in a ring oscillator configuration. Conventional TTL logic gate circuitry utilized for this purpose is shown in FIG. 2. It includes three series-connected, TTL gates comprising Schottky-clamped NPN transistors T1, T2 and T3, respectively, together with corresponding load resistors R1, R2 and R3. As shown in FIG. 2, the output of this TTL gate configuration can be controlled by adjusting the supply voltage $V_{CC}$ applied to the load resistors R1, R2 and R3.

TTL technology represents a compromise between speed and power. The speed-power product of this technology is approximately linear. That is, increased speed results in increased power dissipation, and vice versa, up to a point at which the maximum speed limitation of the gate is reached.

Furthermore, as is well known, when a transistor saturates, a certain amount of time is required before it comes out of saturation. Thus, in digital logic gates, saturation is a speed limitation factor. TTL circuits use transistors in the saturating mode. Therefore, as stated above, while they experience relatively low power dissipation, TTL circuits do not possess the speed characteristics required in some applications.

Emitter-coupled logic (ECL) technology does not allow transistors to saturate. Therefore, ECL gate speeds can be maximized.

FIG. 3 shows a conventional, non-saturating ECL gate configuration. It includes two differential NPN input transistors E1 and E2 with corresponding load resistors R1 and R2 connected between the collectors of the respective devices E1 and E2 and the supply voltage $V_{CC}$. Two diodes D1 and D2, together with resistor RB, bias the base of NPN current source transistor E3 to a two diode level, thus providing a one diode voltage drop across current source resistor R3. This ensures that the voltage swing of resistors R1 and R2 is also one diode since the emitter current and collector current of devices E1 and E2 will be equal, input devices E1 and E2 being configured as an emitter-coupled pair.

The logic swing of the ECL gate shown in FIG. 3 is controlled by the fact that the two load resistors R1 and R2 and the current source resistor R3 are matched. The propagation delay of the gate is determined by the power level set by the load resistors R1 and R2.

Thus, the ECL gate shown in FIG. 3 is basically a differential amplifier with load resistors R1 and R2 that are kept small enough in value to allow corresponding input transistors E1 and E2 to remain out of saturation, even when the differential amplifier is fully switched so that only one of the input transistors E1 or E2 is "on."

However, the fixed values of the load resistors R1 and R2 prevent the control required in VCO applications, since the input control voltage applied at the collectors of devices E1 and E2 remains constant.

Therefore, it would be highly desirable to have available a technique for providing variability in the resistive load of ECL input devices, while ensuring that if the resistive load of one input device changes, all input device resistive loads are changed to be consistent.

SUMMARY OF THE INVENTION

The present invention provides an emitter-coupled logic (ECL) gate configuration that allows variations in the bias current for controlling propagation delay. The ECL circuitry includes a plurality of input transistors having commonly-coupled emitters in the conventional manner, the collector of each input transistor being connected to receive a control voltage. A current source is connected between the commonly-coupled emitters and ground. Circuitry, preferably a variable resistance, is connected between the collectors of the input transistors and a supply voltage. A bias voltage controls the charging current provided to the collectors of the ECL input transistors.

According to a preferred embodiment of the present invention, the emitter-coupled logic gate includes first and second NPN input transistors having commonly-coupled emitters. The base of the first input transistor is connected to receive a first input signal. The base of the second input transistor is connected to receive a second input signal. A first PMOS transistor and a first Schottky diode are connected in parallel between a supply voltage VCC and the collector of the first input transistor. A second PMOS transistor and a second Schottky diode are connected in parallel between VCC and the collector of the second input transistor. A first NPN current source transistor has its emitter coupled to ground. A third PMOS transistor is connected between the common base/collector terminal of the first current source transistor and VCC. A second NPN current source transistor is connected between the commonly-coupled emitters of the first and second input transistors and ground. The base of the second current source transistor is connected to the common base/collector terminal of the first current source transistor. The second current source transistor has twice the current sourcing capability of the first current source transistor. A gate bias voltage is applied to the gate of each of the three PMOS transistors to control the propagation delay of the gate.

Other features and advantages of the present invention will become apparent and be appreciated by reference to the detailed description of the invention provided below, which should be considered in conjunction with the accompanying drawings.

DESCRIPTION OF THE DRAWINGS

FIG. 5 is a schematic diagram illustrating a high frequency ECL voltage controlled ring oscillator circuit that utilizes the ECL gate configuration shown in FIG. 4.

FIG. 5A is a simple logic diagram illustrating the circuit shown in FIG. 5.

DETAILED DESCRIPTION OF THE INVENTION

Figure 1:
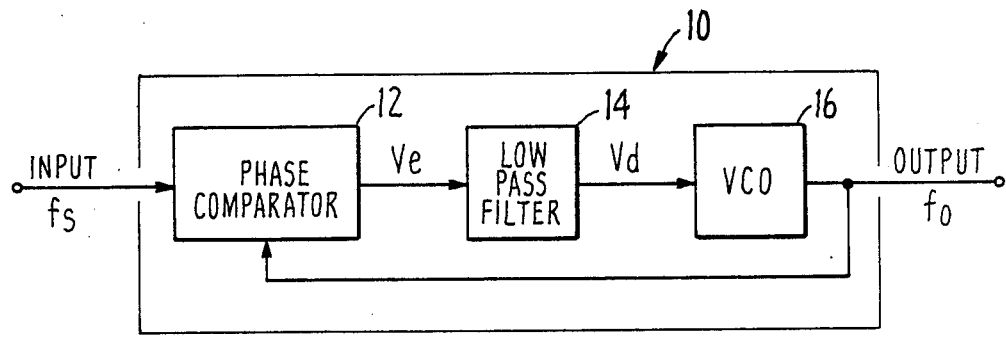
FIG. 1 is a block diagram illustrating a conventional phase-locked loop circuit.
Figure 2:
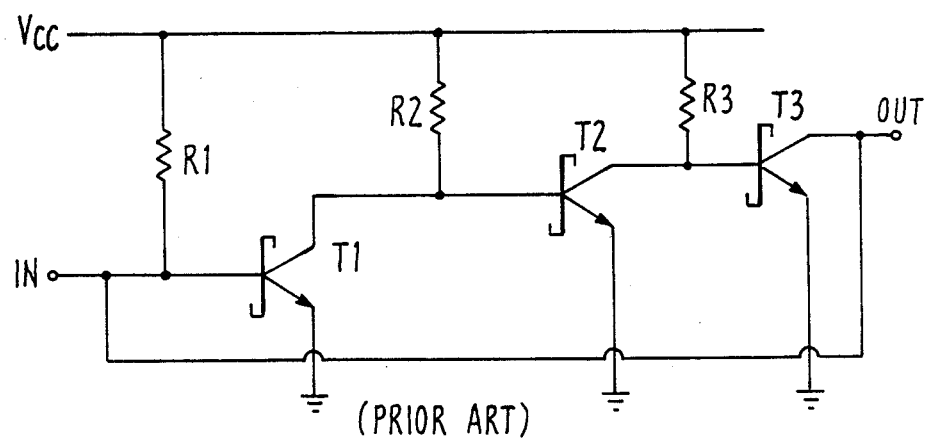
FIG. 2 is a schematic diagram illustrating a conventional transistor-transistor logic (TTL) gate of the type that can be utilized in a PLL.
Figure 3:
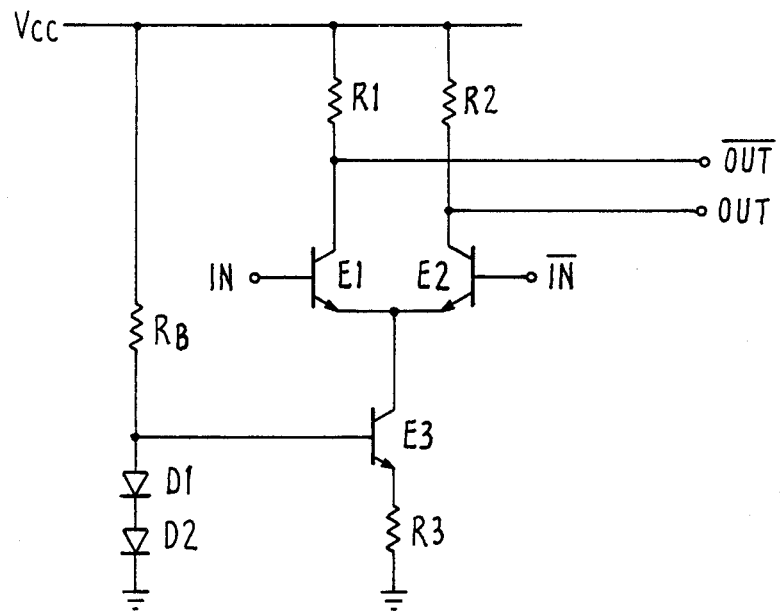
FIG. 3 is a schematic diagram illustrating a conventional emitter-coupled logic (ECL) gate.
Figure 4:
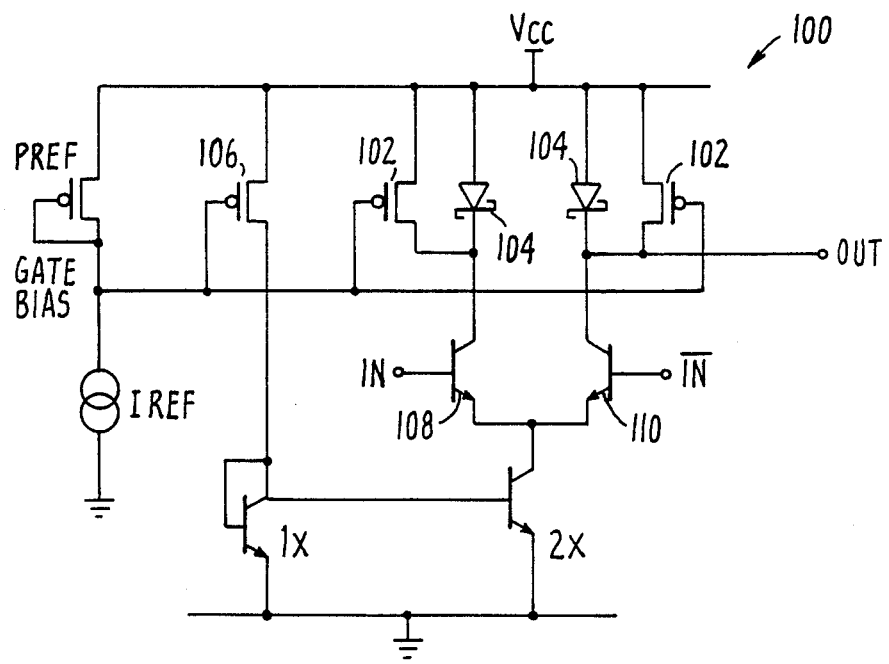
FIG. 4 is a schematic diagram illustrating an ECL gate configuration in accordance with the present invention.

As shown in FIG. 4, the present invention provides an ECL gate configuration 100 that allows the bias current applied to the gate 100 to be varied. This permits the propagation delay of the gate 100 to be changed by way of an input control voltage. Controlling the propagation delay in this manner allows the ECL gate 100 to be used in voltage controlled oscillator applications, as will be described in greater detail below.

With continuing reference to FIG. 4, the structure of the ECL gate 100 is similar to a standard ECL logic gate except that each of the conventional ECL gate collector load resistors is replaced by a PMOS device 102 in parallel with a Schottky diode 104. This configuration makes it possible to vary the gate's effective logic switching currents and propagation delays because the gate bias of the PMOS devices 102 can be varied to mimic an adjustable load resistor. A Schottky diode 102 is present to limit the low level logic swing.

The pull-down current source, comprising NPN devices 1X and 2X, for the gate 100 is controlled by an identically biased PMOS control transistor 106. Device 2X has twice the current sourcing capability of device 1X. Thus, the current of device 106 is scaled up to be twice that of the upper PMOS source, i.e. elements 102 and 104, so that, during transitions, the charging currents at the collectors of the input transistors 108, 110 are matched.

The collector of the common-emitter, differential pair NPN transistor, i.e. either device 108 or device 110, which is "off" is held at a logic "high" level by one of the PMOS devices 102 at a 1X current sourcing magnitude. The collector of the differential pair NPN transistor (108, 110) which is "on" is held "low" at one Schottky diode voltage drop below VCC by the pull-down current source device 2X. The 2X current for the "low" level collector comprises 1X sourced by the appropriate PMOS device 102 and 1X sourced by the corresponding Schottky diode 104.

During switching transients, the net positive charging current is 1X. The net negative charging current is also 1X as a result of the 1X DC currents demanded of the PMOS device 102, which is always "on" independent of its logic state.

Included in the FIG. 4 embodiment of ECL gate 100 is a current-to-voltage converter, comprising current source IREF and PMOS device PREF, which provides a linear current and, thus, eliminates the non-linear $V_{gs}$ voltage attributes of PMOS devices 102 and 106.

FIG. 5 shows a three-stage voltage controlled ring oscillator that utilizes three ECL gates 100 of the type described above. Like numerals in FIGS. 4 and 5 identify corresponding circuit elements.

In the ring oscillator shown in FIG. 5, the simple current mirror shown in FIG. 4 as including current source devices 1X and 2X, has been modified to provide a more conventional compound current mirror structure. NPN devices 112 and 114 have been added as current sources for the emitter followers 120. Degeneration resistors 116 have been added. Also, two half-value emitter degeneration resistors 118 have been added between ground and each of devices 2X.

Furthermore, conventional compensation circuitry comprising resistors 121, 122 and capacitor 124 has been added. Also, cascade-connected PMOS devices 126 have been added to constrain the source/drain voltage of device 106, much as are the source/drain of devices 102.

It should be understood that various alternatives to the embodiment of the invention described above may be utilized in practicing the invention. For example, the source/gate/drain terminals of the PMOS devices shown in FIGS. 4 and 5 can be directly mapped into PNP emitter/base/collector terminals. Thus, it is intended that the following claims define the scope of the invention and that circuits within the scope of these claims and their equivalents be covered thereby.

What is claimed is:

1. Emitter-coupled logic circuitry comprising:
   (a) a plurality of input transistors having commonly-coupled emitters, each input transistor having a collector;
   (b) a current source connected between the commonly-coupled emitters and ground; and
   (c) variable resistive means connected between the collectors of the input transistors and a supply voltage for controlling the charging current provided to the collectors of the input transistors.

2. Emitter-coupled logic circuitry comprising:
   (a) first and second input transistors having commonly-coupled emitters, each input transistor having a collector;
   (b) first variable resistive means connected between the collector of the first input transistor and a supply voltage;
   (c) second variable resistive means connected between the collector of the second input transistor and the supply voltage;
   (d) current source variable resistive means connected between the commonly-coupled emitters and ground; and
   (e) means for controlling the impedance of the first variable resistive means and of the second variable resistive means such that the impedances of the first, second and current source variable resistive means are substantially equal.

3. Emitter-coupled logic circuitry as in claim 2 wherein each of the first and second variable resistive means comprises a pull up load and means for clamping the pull up load.

4. Emitter-coupled logic circuitry as in claim 2 wherein each of the first and second variable resistive means comprises:
  (a) a PMOS transistor having its source connected to the supply voltage, its drain connected to the collector of the corresponding input transistor, and its gate connected to receive a gate bias voltage; and
  (b) a Schottky diode connected between the supply voltage and the drain of the PMOS transistor.

5. Emitter-coupled logic circuitry comprising:
  (a) first and second input transistors having commonly-coupled emitters;
  (b) first variable resistive means comprising a first PMOS transistor having its source connected to a supply voltage, its drain connected to the collector of the first input transistor and its gate connected to receive a gate bias voltage and a first Schottky diode connected between the supply voltage and the drain of the first PMOS transistor;
  (c) second variable resistive means comprising a second PMOS transistor having its source connected to the supply voltage, its drain connected to the collector of the second input transistor and its gate connected to receive the gate bias voltage, and a second Schottky diode connected between the supply voltage and the drain of the second PMOS transistor; and
  (d) current source means connected between the commonly-coupled emitter and ground.

6. Emitter-coupled logic circuitry as in claim 5 wherein the current source means comprises:
  (a) a first current source transistor having its emitter coupled to ground and a common base/collector terminal;
  (b) a third PMOS transistor having its drain connected to the common base/collector terminal of the first current source transistor, its source connected to the supply voltage, and its gate connected to the gate bias voltage; and
  (c) a second current source transistor having its collector connected to the commonly-connected emitters, its emitter connected to ground and its base connected to the common base/collector terminal of the first current source transistor.

7. Emitter-coupled logic circuitry as in claim 6 and further including conditioning circuitry comprising:
  (a) a fourth PMOS transistor having its source connected to the supply voltage and its commonly-connected drain/gate terminals connected to the gate bias voltage; and
  (b) a current source connected between commonly-connected drain/gate terminals of the fourth PMOS transistor and ground.

8. An emitter-coupled logic gate comprising:
  (a) first and second NPN input transistors having commonly-coupled emitters, the base of the first input transistor being connected to receive a first input signal, the base of the second input transistor being connected to receive a second input signal;
  (b) a first PMOS transistor and a first Schottky diode connected in parallel between a supply voltage and the collector of the first input transistor;
  (c) a second PMOS transistor and a second Schottky diode connected in parallel between the supply voltage and the collector of the second input transistor;
  (d) a first NPN current source transistor having its emitter coupled to ground and a common base/collector terminal;
  (e) a third PMOS transistor connected between the common base/collector terminal of the first current source transistor and the supply voltage source;
  (f) a second NPN current source transistor connected between the commonly-coupled emitters of the first and second input transistors and ground, the base of the second current source transistor being connected to the common base/collector terminal of the first current source transistor, the second current source transistor having twice the current sourcing capability of the first current source transistor; and
  (g) means for providing a gate bias voltage to the gate of each of the first, second and third PMOS transistors.

9. A voltage controlled oscillator (VCO) comprising a plurality of series-connected emitter-coupled logic (ECL) gates, each ECL gate comprising:
  (a) a plurality of input transistors having commonly-coupled emitters, each input transistor having a collector;
  (b) a current source connected between the commonly-coupled emitters and ground; and
  (c) variable resistive means connected between the collectors of the input transistors and a supply voltage for controlling the charging current provided to the collectors of the input transistors.

10. A voltage controlled oscillator (VCO) comprising a plurality of series-connected emitter-coupled logic (ECL) gates, each ECL gate comprising:
  (a) first and second NPN input transistors having commonly-coupled emitters, each input transistor having a collector;
  (b) first variable resistive means connected between the collector of the first input transistor and a supply voltage for controlling the charging current provided to the collector of the first input transistor;
  (c) second variable resistive means connected between the collector of the second input transistor and the supply voltage for controlling the charging current provided to the collector of the second input transistor;
  (d) current source variable resistive means connected between the commonly-coupled emitters and ground; and
  (e) means for controlling the impedance of the first variable resistive means and of the second variable resistive means such that the impedances of the first, second and current source variable resistive means are substantially equal.

11. A voltage controlled oscillator as in claim 10 wherein each of the first and second variable resistive means comprises:
  (a) a PMOS transistor having its source connected to the supply voltage, its drain connected to the collector of the responding input transistor, and its gate connected to receive a gate bias voltage; and
  (b) a Schottky diode connected between the supply voltage and the drain of the PMOS transistor.

* * * * *

UNITED STATES PATENT AND TRADEMARK OFFICE
CERTIFICATE OF CORRECTION

PATENT NO. : 4,876,519

DATED : 10/24/89

INVENTOR(S) : Davis et al.

It is certified that error appears in the above-identified patent and that said Letters Patent is hereby corrected as shown below:

Col. 1, line 68, "RB" should be --$R_B$--.

Col. 4, line 23, "cascade-connected" should be --cascode-connected--.

Signed and Sealed this

Eighteenth Day of September, 1990

Attest:

HARRY F. MANBECK, JR.

*Attesting Officer*　　　　*Commissioner of Patents and Trademarks*